United States Patent [19]
Wagner et al.

[11] Patent Number: 5,196,377
[45] Date of Patent: Mar. 23, 1993

[54] METHOD OF FABRICATING SILICON-BASED CARRIERS

[75] Inventors: John J. Wagner, Eleva; Thomas P. Chojnacki, River Falls; Delvin D. Eberlein, Altoona, all of Wis.

[73] Assignee: Cray Research, Inc., Eagan, Minn.

[21] Appl. No.: 747,523

[22] Filed: Aug. 20, 1991

Related U.S. Application Data

[63] Continuation-in-part of Ser. No. 631,376, Dec. 20, 1990, abandoned.

[51] Int. Cl.⁵ .......................................... H01L 21/302
[52] U.S. Cl. ................................. 437/225; 437/195; 437/203; 437/974
[58] Field of Search ............... 437/225, 209, 211, 215, 437/228, 974; 357/71, 55; 148/DIG. 135

[56] References Cited

U.S. PATENT DOCUMENTS

| | | |
|---|---|---|
| 3,288,639 | 11/1966 | Smith, Jr. . |
| 3,878,554 | 4/1975 | Mikome et al. . |
| 4,040,078 | 8/1977 | Eckton, Jr. et al. ............... 357/55 |
| 4,263,606 | 4/1981 | Yorikane . |
| 4,374,457 | 2/1983 | Wiech, Jr. . |
| 4,410,622 | 10/1983 | Dalal et al. . |
| 4,417,392 | 11/1983 | Ibrahim et al. . |
| 4,517,252 | 5/1985 | Hugh . |
| 4,690,833 | 9/1987 | Donson et al. . |
| 4,699,871 | 10/1987 | Holz . |
| 4,770,897 | 9/1988 | Wu ................................. 437/228 |
| 4,802,062 | 1/1989 | Blum et al. . |
| 4,843,188 | 6/1989 | Patterson et al. . |
| 4,866,501 | 9/1989 | Schanefield ........................ 357/71 |
| 4,918,811 | 4/1990 | Eichelberger et al. . |
| 4,931,853 | 6/1990 | Ohuchi et al. . |
| 4,972,253 | 11/1990 | Palino et al. ....................... 357/71 |
| 4,980,219 | 12/1990 | Hiraide et al. . |
| 5,023,205 | 6/1991 | Reche ............................... 437/225 |
| 5,063,177 | 11/1991 | Geller et al. ...................... 437/974 |

FOREIGN PATENT DOCUMENTS

| | | |
|---|---|---|
| 0145862 | 9/1984 | European Pat. Off. . |
| 0190490 | 8/1986 | European Pat. Off. . |
| 2945385 | 5/1980 | Fed. Rep. of Germany . |
| 53-68971 | 6/1978 | Japan .............................. 437/203 |
| 0117447 | 5/1988 | Japan .............................. 437/203 |

OTHER PUBLICATIONS

Article entitled "Silicon Hybrid Wafer-Scale Package Technology", by Johnson et al., pp. 845-851, Oct. 1986, IEEE Journal of Solid State Circuits.

Primary Examiner—Brian E. Hearn
Assistant Examiner—Michael Trinh
Attorney, Agent, or Firm—Merchant, Gould, Smith, Edell, Welter & Schmidt

[57] ABSTRACT

Silicon is used to create multi-chip carriers for integrated circuits. The process of fabricating the carriers uses standard integrated circuit fabrication equipment. Cavities are etched into a silicon wafer, metallization or polysilicon is deposited to electrically interconnect the cavities, and integrated circuit die are placed in the cavities. Traces connecting the integrated circuits are buried in channels formed in the silicon, which can be doped and biased to provide enhanced isolation between traces as well as control over the electrical characteristics of the traces. The traces can be formed in multiple layers of material placed on the wafer to provide additional communication capacity in the carriers.

33 Claims, 9 Drawing Sheets

METHOD OF FABRICATING SILICON-BASED CARRIERS

This application is a continuation-in-part of U.S. patent application Ser. No. 07/631,376, filed on Dec. 20, 1990, abandoned, which is hereby incorporated by reference.

BACKGROUND OF THE INVENTION

1. Field of the Invention

This invention relates generally to packaging for integrated circuits and, in particular, is directed to the fabrication of silicon-based chip carriers.

2. Description of Related Art

Integrated circuits are typically packaged in individual packages or carriers with the electrical interconnections between the packages provided by printed circuit boards. To improve circuit speed, manufacturers of electronic devices and, more importantly makers of high speed digital computers, strive to increase the density of both integrated circuits and circuit boards. As the active components of a circuit are brought physically closer together, the inherent delay associated with the transmission of electrical signals over interconnect lines is minimized. One major concern associated with the close physical placement of circuits, however, is the buildup of heat in a localized area. Another major concern is the level of cross-talk between the signal traces connecting such circuits, which can also limit the proximity of the circuits.

Chip carriers for individual high density integrated circuits are typically fabricated using a variety of substrates onto which metallized traces are placed to provide electrical connections from the periphery of the substrate to the integrated circuit packaged within. These traces are typically manufactured using printed circuit board technology and methods of miniaturizing that technology. Such techniques, however, result in carriers which consume large areas and which require longer connection lines between integrated circuits. The longer connection lines can ultimately slow the processing speed of machines using such carriers.

The need to provide increasing numbers of connections in a given area has resulted in the use of thin-film technology to bring traces from the integrated circuit to pins on the carrier. One technique is described in the co-pending and commonly assigned U.S. patent application Ser. No. 506,729, filed Apr. 9, 1990 by Steitz et al., entitled "METHOD OF FABRICATING METALLIZED CHIP CARRIERS FROM WAFER-SHAPED SUBSTRATES", which is incorporated herein by reference. That application, which is not prior art to the present invention, describes wafer-shaped substrates and thin-film manufacturing techniques for creating high density traces on chip carriers, with the carriers formed in the substrate prior to, or subsequent to, the formation of the traces. This technique attempts to further increase packing density of circuits.

Another attempt to increase packing density in circuits is wafer-scale integration. In this approach, the entire silicon wafer is fabricated using integrated circuit processing techniques to create a single, extremely dense circuit. These attempts have typically failed, however, due to the low overall yield of the processing technology. The low-yield resulted from the dependence of the overall yield on the individual yield rates of the low-yield devices placed within the single substrate.

SUMMARY OF THE INVENTION

The present invention describes a packaging method wherein cavities and channels are etched into a silicon wafer, metallization is deposited in the channels to electrically interconnect the cavities, and integrated circuit die are placed in the cavities. Such a process allows the use of well-known integrated circuit processing techniques in a new application in which the structures are sufficiently enlarged to provide a silicon wafer-based integrated circuit carrier offering high density packaging with high yield processes.

In this fashion, the integrated circuits are manufactured using high-yielding processes whereby only good circuits are placed on the carrier. The fabrication of traces in channels in the carrier does not entail any low-yielding processing, such that an overall high-yield product results. The use of a silicon carrier for packing integrated circuits fabricated with silicon or other materials such as Gallium Arsenide provides an excellent thermal match for heat dissipation and extremely high thermal conductivity for dissipating heat generated by the active components of the circuits.

In addition, burying traces within channels in the silicon substrate can provide an increase in the isolation between closely spaced traces, as well as offering the ability to control the capacitance of the traces. In this embodiment, an insulating layer can be formed in the channels through oxidation. In such an embodiment, the traces can be formed of either a metal layer (single or multi-layer) as well as a doped polysilicon in place of the metal traces. The substrate can also be provided as a conductive silicon by implantation or other methods, which provides even greater isolation between traces because the substrate can act as a ground plane.

A further advantage of burying the traces in channels in the substrate is that the topography of the carrier is reduced, resulting in a substantially more planar carrier surface. That reduced topography allows easier and more positive hermetic sealing of the carrier with a lid.

The alternate preferred method of providing a chip carrier having multi-layers of traces provides the advantages of increased communication capacity on the carrier as well as the opportunity to construct high-yield devices such as resistors and capacitors which are integral with the carrier. Both the multi-layer traces and integral devices provide increased space savings useful in modern high-speed computing devices.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred methods, reference is made to the accompanying drawings which form a part hereof, and in which is shown by way of illustration specific methods in which the invention may be practiced. It is to be understood that other methods may be utilized and process changes may be made without departing from the scope of the present invention.

The present invention describes a process which creates die packages using silicon substrates and standard integrated circuit fabrication technologies. These fabrication technologies can create a plurality of carriers from a single wafer.

There are a number of advantages to using silicon as compared to other, more conventional materials, e.g., ceramic-based materials. Ceramic tooling is laborious and expensive to produce; techniques for working ceramic cannot meet the tolerances required; and ceramic is not as conducive to thermal dissipation. Thus, the preferred embodiment of the present invention uses silicon to create carriers for integrated circuits because of silicon's numerous advantages.

One advantage of silicon is the benefit of proven manufacturing techniques. Working with silicon results in reduced development time and quick turnaround. The fabrication process simply requires placing the cavities consistent with the need for traces, making a mask, shooting the mask, placing the die, and interconnecting the die. Standard integrated circuit fabrication technology is very mature, thus manufacturers can expect high yields from the wafers. Silicon fabrication techniques have the advantage of micron-level dimensional control of trace channels, metallization and die cavities. Standard integrated circuit fabrication technologies make it easy to maintain tolerances in silicon packages. To overcome the fragile nature of thin silicon wafers, thicker silicon wafers can be used to add rigidity and increased heat sinking capabilities.

Silicon also provides improved lead-to-lead electrical isolation. Conductive silicon also acts as a ground plane, reducing crosstalk between traces. Silicon fabrication techniques also allow higher density metallization and multi-level metallization. Further, multi-chip packages are easily fabricated using wafer scale die-to-die interconnects.

Silicon conducts heat better than alumina-based ceramics. Further, silicon provides a perfect match to the thermal characteristics of the silicon die contained within the carrier.

Silicon also provides improved reworkability. If flip-chip bonding techniques are used on the silicon wafer, the need for wire bonds is eliminated (except to external devices). If the dies are countersunk, i.e., recessed into cavities in the silicon wafer, the wire bonds can be clipped, the die released, new die inserted, and new wire bonds attached further in on the leads.

The use of channels for the traces of the present invention also provides the advantage of lower topography than comparable carriers. That reduced topography allows easier and better hermetic sealing of the carrier when lids are used because the variation in height between the wafer and traces is on the order of only a few microns, with the possibility of reducing the variations to less than one micron. Hermetic sealing is particularly important where bi-metal processing is used in constructing the carriers.

An additional alternate method involves the use of doped polycrystalline silicon as the substrate. In such a method, channels can be formed in the substrate by etching and oxidation which results in a layer of silicon dioxide within the channel to insulate the trace from the substrate.

The method of processing a silicon wafer based carrier with a single layer of traces can differ from the method used in producing carriers with multi-layers of traces located on the top surface of the wafer. The methods differ because multi-layer trace carriers are typically manufactured with doped polysilicon traces in their lower levels, while single layer trace carriers can be manufactured with either metallic or doped polysilicon traces.

I. SINGLE-LAYER TRACE PROCESS

Figure 1:
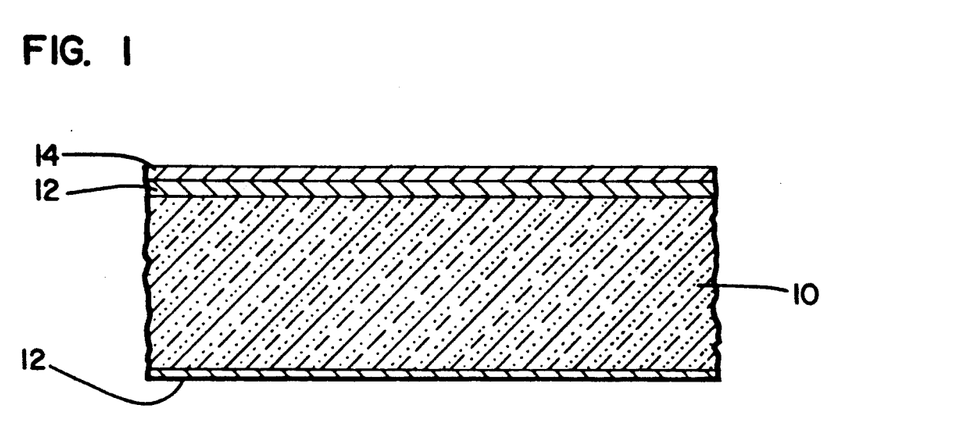
FIG. 1 is a partial cross-sectional view of the preferred starting wafer with initial coatings.
Figure 14:
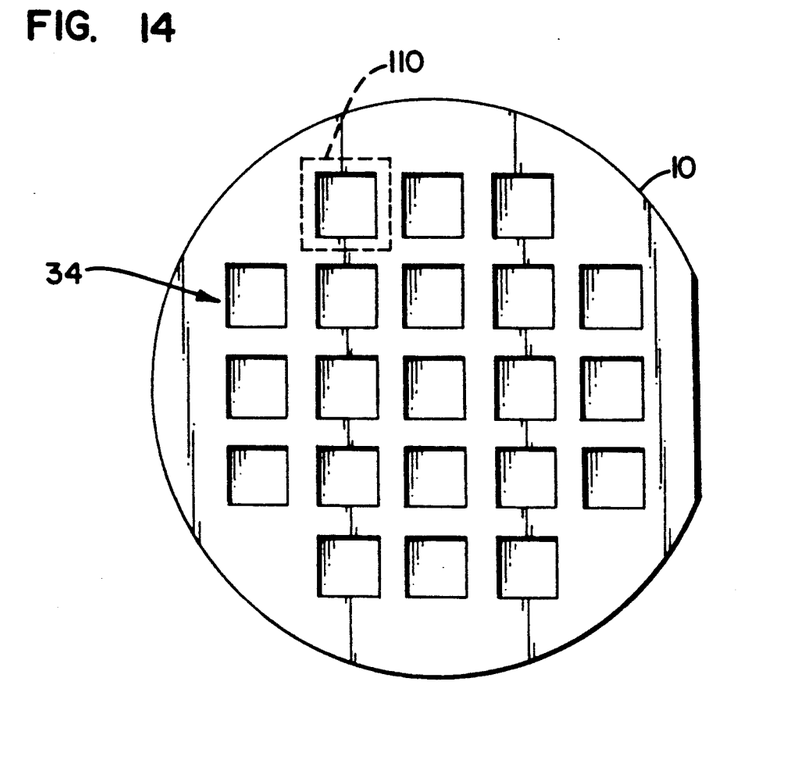
FIGS. 14, 15, 16, and 17 are top views of some typical wafer configurations.

Producing a single layer trace carrier begins with the formation of a 60 mil thick silicon wafer having a keyed shape similar to that of a semiconductor wafer. The preferred shape is illustrated in FIG. 14. Referring to FIG. 1, the wafer 10 is coated on both its top and bottom surfaces with a CVD base nitride 12. In the preferred method, this base nitride 12 is covered by an additional layer of plasma nitride 14 which is deposited only on the top surface of the wafer 10 for additional electrical isolation as well as to provide a highly inert etching mask for the silicon cavity etch which will follow later in the processing of the preferred method.

After the nitride layers 12 & 14 have been deposited, the top surface of the wafer 10 is covered with a photoresist material which is baked, exposed and developed to define the channels 20 into which the traces will be placed. With the channels 20 defined, they are etched into the top surface of the wafer 10 after which the photoresist material is removed, as illustrated in FIG. 2.

The channels 20 are preferably etched to a depth of 3 mils and width of 20–30 microns. The channel dimensions are, however, variable depending on required trace size and desired capacitance characteristics. It is the combination of channel width and additional isolation provided by the buried traces which provides significant advantages to the present invention. The primary advantage is that the traces can be placed in close proximity to each other in the carriers. The primary limiting factor is the feature definition available in current photolithography techniques, i.e., approximately 1-2 microns between traces. In contrast, spacing between traces in conventional IC carriers is approximately 25-50 microns (1-2 mils). Thus it can be seen that the present invention does offer significant advantages over the prior art.

Figure 2:
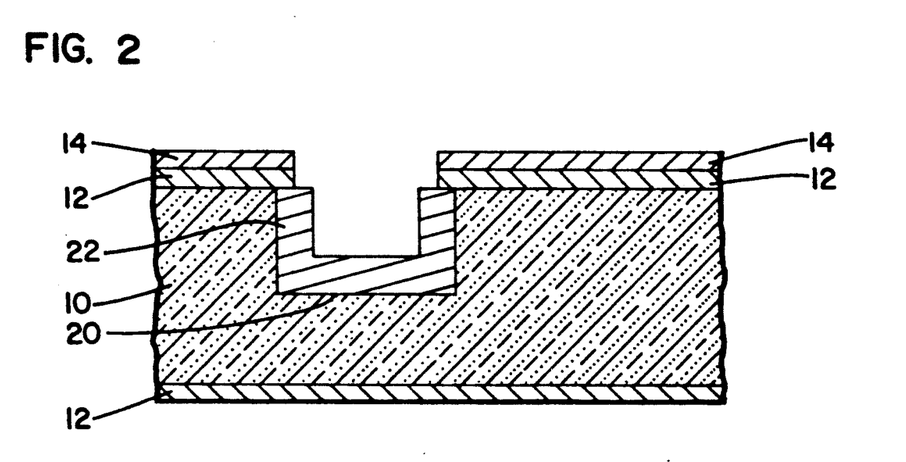
FIG. 2 depicts an embodiment of the trace channel structure including a separate isolation layer in the trace channel.

Referring to FIG. 2, the isolation of the channels 20 can be performed with a variety of processes. However, the preferred process is through oxidation because it produces a layer 22 of silicon dioxide in each of the channels 20 which provides the required insulating layer between the traces and the substrate 10. Alternately, the insulating layer 22 can be comprised of a variety of other insulating materials including, but not limited to, silicon nitride or any insulating dielectric.

It will be understood by those skilled in the art that in the preferred method, the channels 20 are etched in the wafer 10 as an early step in the process. It will also be understood that the channels 20 could be etched into the substrate 10 at any other step in the process provided that any masking material used sufficiently protected any other features currently on the package, such as bonding pads or surface-mounted traces. For example, if the channels 20 are etched after the bonding pads 28 (described below) have been deposited, the masking material must sufficiently protect those features from degradation during etching.

Figure 3:
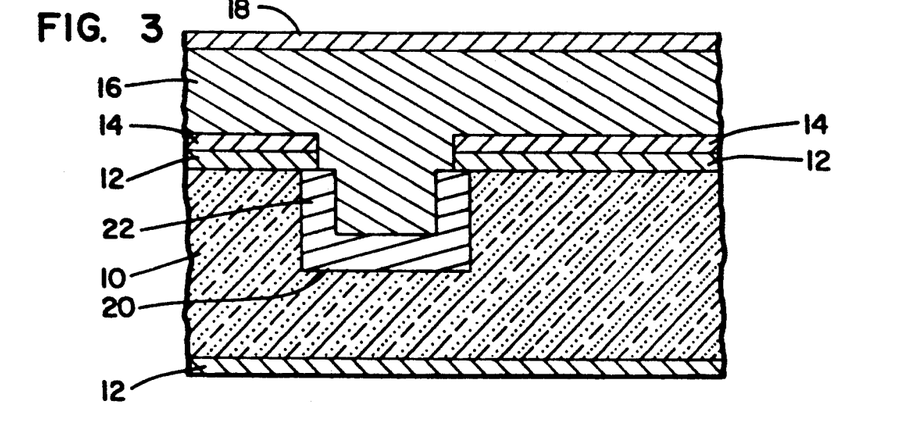
FIG. 3 depicts the structure of FIG. 2 with additional masking layers placed on its upper surface.
Figure 4:
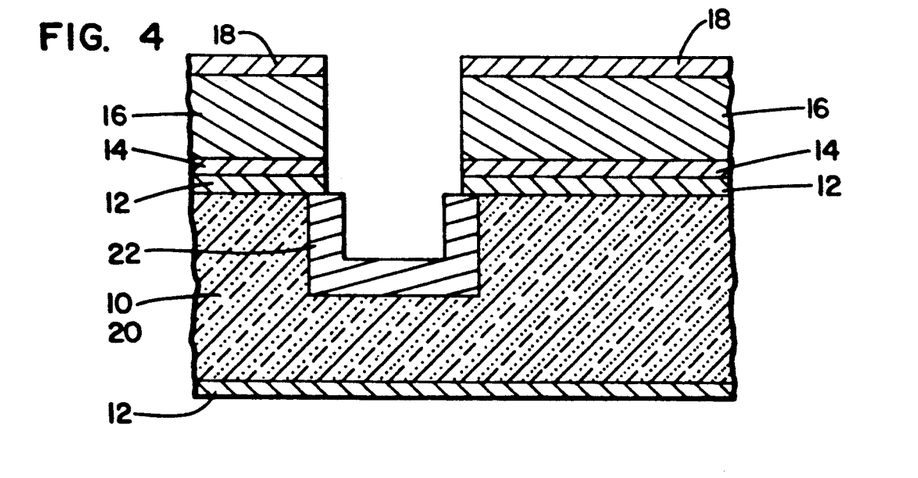
FIG. 4 depicts the structure of FIG. 3 with the masking layers etched to clear the trace channels of the present invention.

Referring to FIGS. 3 & 4, after the channels 20 have been etched and, if required, lined with an insulating layer 22, the entire top surface of the wafer 10 is coated with a lift-off polyimide 16. After the lift-off polyimide 16 has been deposited, a plasma oxide lift-off mask 18 is also formed on the top surface of the wafer 10. The lift-off plasma oxide mask 18 is plasma etched to reveal the lift-off polyimide layer 16 in the channels 20. The lift-off polyimide layer 16 in the channels 20 is then also plasma etched to clear them for deposit of the traces.

In addition to placing the traces in channels 20, a variety of techniques can also be employed to increase the isolation between traces in the carrier. Among those techniques are implant doping of the silicon wafer 10 to increase its conductivity which could allow it to be held at a constant potential. Similarly, the entire top surface of the wafer 10 could be coated with a layer of doped polysilicon to provide increased conductivity. An alternate method of increasing isolation of the traces would be to line the channels 20 with a layer of metal (not shown) and then deposit an additional insulation layer 22. This metal layer could then be held at a constant potential to provide additional isolation between traces. Although not specifically mentioned with regard to the following detailed descriptions, it should be understood that any of these isolation techniques could be used in the following embodiments as desired by the user.

After formation of the channels, processing of the wafer 10 differs depending on whether homogeneous metal traces, bi-metal traces, or polysilicon traces are desired. The bi-metal trace process will be described first, the homogeneous metal trace process will be described second and the polysilicon trace process will be described last.

A. Bi-Metal Trace Process

Figure 5:
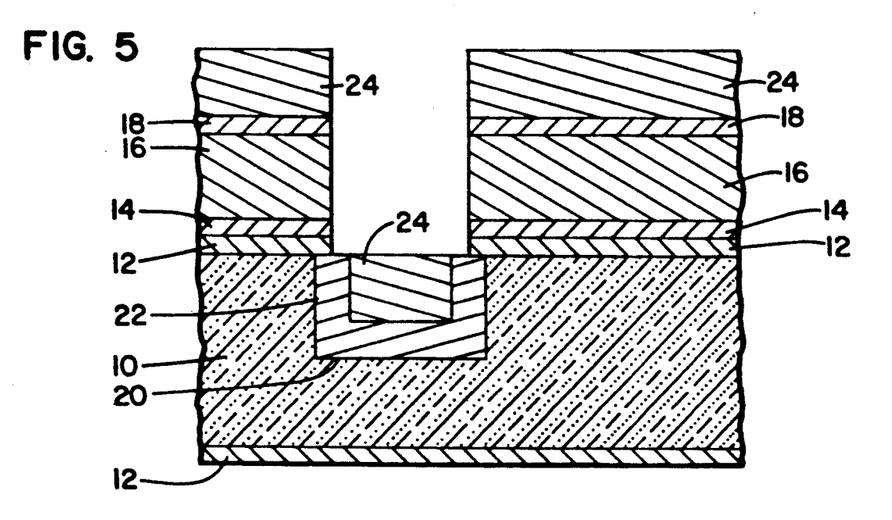
FIG. 5 depicts the structure of FIG. 4 with an additional layer of metallization applied to the upper surface of the wafer and in the trace channel.
Figure 6:
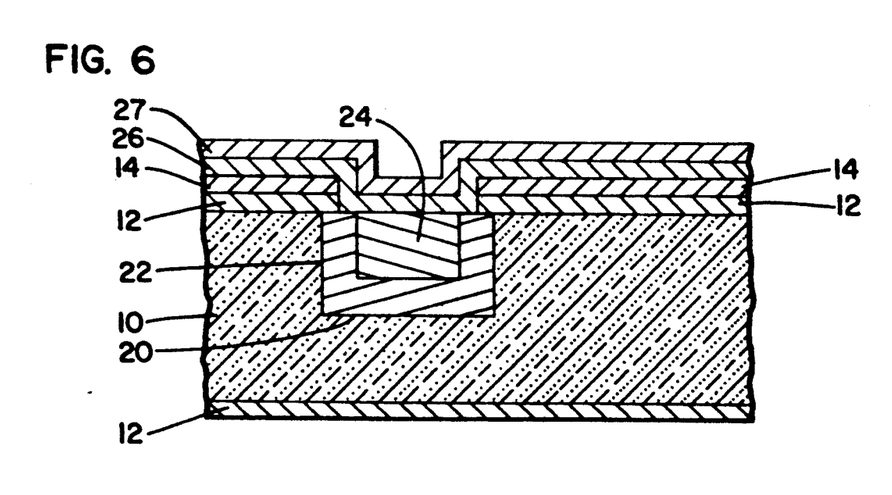
FIG. 6 depicts the structure of FIG. 5 with a layer of barrier metallization and bonding pad metallization.
Figure 7:
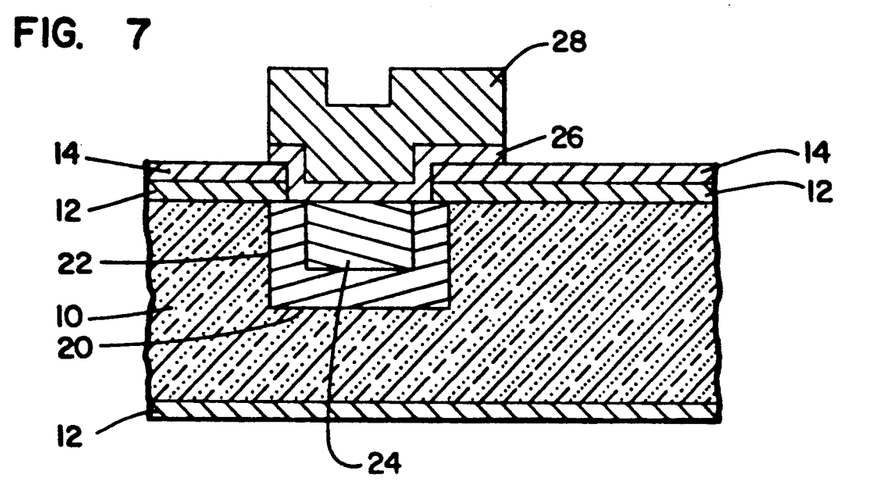
FIG. 7 is a partial cross-sectional view of the preferred wafer with bi-metal trace and bonding pad metallization formed thereon.

Referring to FIGS. 5, 6 & 7, in the preferred bi-metal trace process a six micron layer 24 of gold is deposited on the entire top surface of the wafer 10 including in the channels 20 formed in the top surface. The gold can be applied by evaporation, sputtering or any other suitable method. When the gold is deposited, the gold outside of the channels 20 is then removed by stripping the lift-off polyimide layer 16 from the top surface of the substrate 10. Those skilled in the art will recognize that an alternate method of applying the gold layer would be to plate up the gold on a layer of seed platinum. The details of this plate-up technique are described below with respect to the homogeneous metal trace process.

After the gold 24 is in channel 20, a barrier metal 26 is deposited on the top surface of the substrate 10 and on the gold 24 in the channels 20. The barrier metallization layer 26 is preferably comprised of 4000 Å of titanium-tungsten (TiW). The barrier metallization layer 26 prevents interdiffusion of the metals and other problems such as adhesion when gold traces are used in conjunction with aluminum bonding pads 28, as in the preferred multi-metal trace embodiment. Interdiffusion of certain metals like gold and aluminum, leads to poor bond integrity and probable contact failure. Those skilled in the art will readily recognize that other materials or combinations of materials could be used as barriers including, but not limited to, titanium-nitride (TiN).

After the barrier metal 26 has been deposited, a three micron layer of aluminum 27 is deposited on the top surface of the wafer 10 which will be used to form aluminum bonding pads for connection to the integrated circuits which will be placed in the cavities yet to be formed.

Aluminum is preferably used for the bonding pads 28 when the pads on the integrated circuits which will be placed in the cavities are aluminum. Thus, using aluminum for the pads 28 prevents bonding problems between the integrated circuit and the carrier. Gold is preferably used for the trace metallization layer 24 because the pads on printed circuit boards are typically gold. Thus, using gold for the trace metallization layer 24 prevents bonding problems between the carrier and the printed circuit board. Those skilled in the art will recognize that other metals could be substituted for those described above.

After the aluminum 27 is deposited, a layer of photoresist material is applied to the top surface of the wafer 10, baked, developed and exposed to define the bonding pads 28. After the photoresist material is in place, the entire top surface of the wafer 10 is plasma etched to remove the aluminum 27 and barrier metal 26 surrounding the bonding pads 28 (which are protected by the photoresist material). After the etching process is complete, the photoresist material is also removed. At this point in the process, the bi-metal trace and bonding pad metallization is in place, as illustrated in FIG. 7. It will be appreciated by those skilled in the art that any variety of suitable metals could be used in place of those described above. In addition, more than three metals could be used, where desired or necessary.

B. Homogeneous Metal Trace Process

Figure 8:
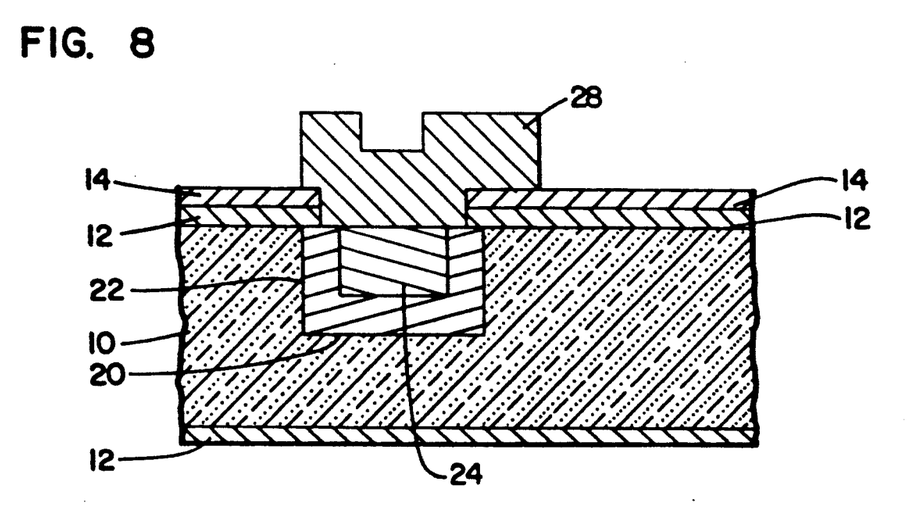
FIG. 8 is a partial cross-sectional view of the preferred wafer with homogenous trace and bonding pad metallization formed thereon.

In the homogeneous metal trace process, the barrier metal process described above is avoided. The preferred metal in the homogeneous metal process is gold, although any other suitable metal, such as aluminum, could be used in place of gold. Referring to FIGS. 5, 6 & 8, the preferred process includes the deposition of a six micron layer of homogeneous metal 24 on the top surface of the wafer 10 as described above with respect to the bi-metal process. The metal 24 outside of the channels 20 is then removed by stripping the lift-off polyimide layer 16 from the top surface of the wafer 10. An additional layer of metal 27 is then deposited on the top surface of the wafer 10 to form the bonding pads 28. That additional layer of metal 27 is etched off in a photoresist and etching process similar to that described above for the bi-metal process.

Figure 9:
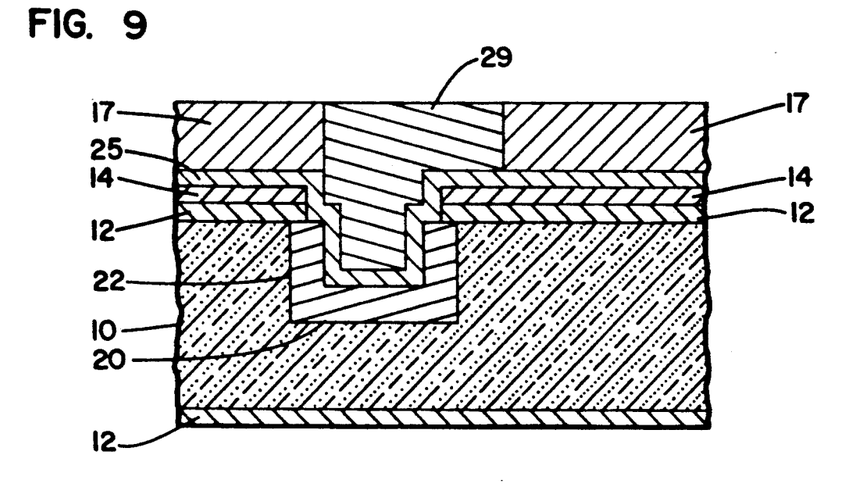
FIG. 9 is a partial cross-sectional view of an alternate process in which the trace and bonding pad are plated up through a combination of thin-film deposition and electrolytic plating.

Referring to FIG. 9, an alternate method for metals which are difficult to etch involves the application of a thin layer of metal 25, preferably platinum, on the top surface of the wafer 10 by sputtering or any other suitable process, followed by an application of a masking material 17 to field areas other than the bond pads. After masking, the areas not covered by the mask 17 are built up to form integral traces and bonding pads 29 by electrolytic plating. The mask is removed after plating and the metal 25 in the field areas is removed by etching, sputtering or other suitable processes.

After the metal processing is complete, the wafer 10 includes integral bonding pads and trace metallization 29.

C. Polysilicon Trace Processing

An alternate preferred method includes traces comprised of doped polysilicon or doped amorphous silicon. The methods used are substantially the same as those used in conventional integrated circuit processing and will be known to those skilled in the art.

Figure 10:
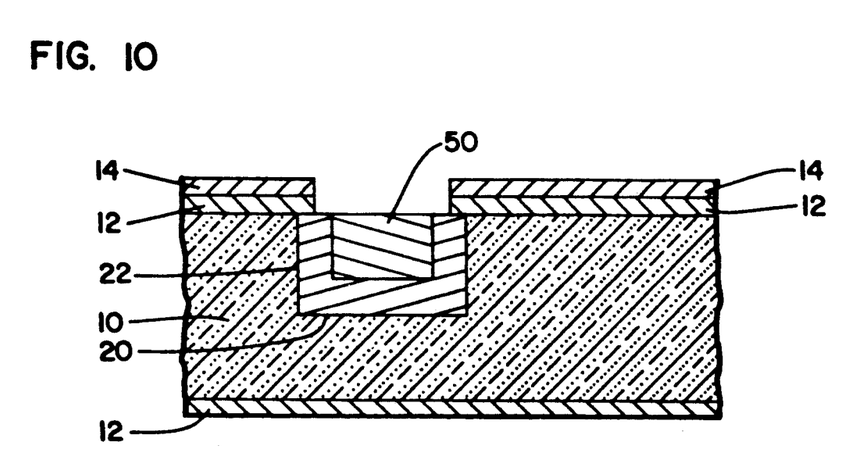
FIG. 10 is a partial cross-sectional view of an alternate embodiment wherein the trace comprises doped polysilicon.

Referring to FIG. 10, the traces can be formed in channels 20. In that construction, the traces are formed in substantially the same method as described above with the primary difference being that the preferred method of forming the doped polysilicon traces 50 is by chemical vapor deposition in the channels 20. The polysilicon deposits conformally over the entire surface of the wafer 10. To fill the channels, the thickness of the deposited polysilicon must be greater than two times the width of the channel 20. Typical deposition rates of polysilicon are fairly low, which limits the total thickness of any deposited polysilicon layer, thus limiting the trace width to typically a few microns. It should be noted that this limitation does not affect trace length, but only their width.

The polysilicon deposition step is followed by a planarization etch-back process. That process involves coating the top surface of the wafer with a photoresist or polyimide to planarize the surface. The photoresist or polyimide can then be etched with a process which etches the polysilicon at the same rate so that any topography in the polysilicon layer will be removed before the polysilicon layer clears from the field area surrounding the traces. Typical etch rates of polysilicon also preclude the use of very thick films (and, thus, wide traces) because of the long etch times required in the planarization process. The etch is stopped just as the polysilicon clears from the field.

II. MULTI-LAYER TRACE PROCESS

Figure 11:
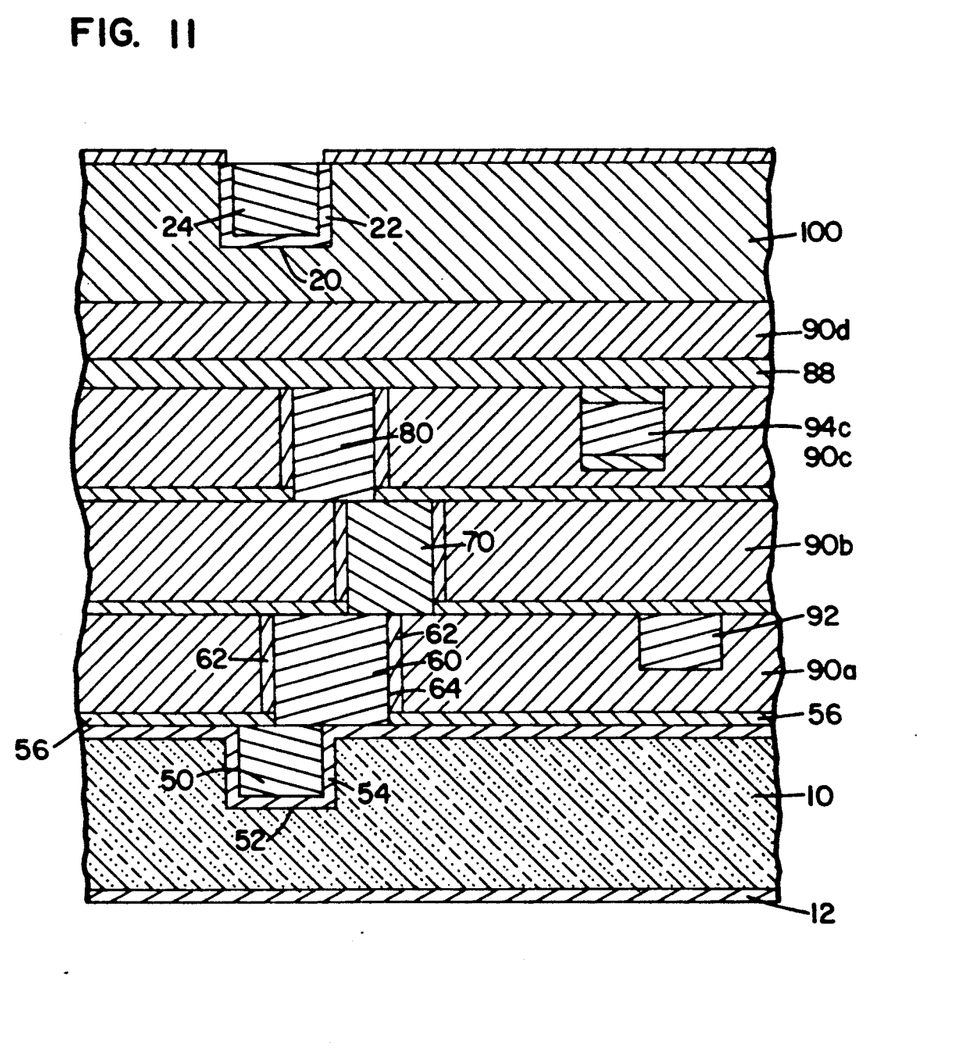
FIG. 11 is a partial cross-sectional view of a multilayer chip carrier construction according to the present invention.

The process of forming a multi-layer trace carrier is a variation of the single layer polysilicon trace and metal trace processes described above. Referring to FIG. 11, wherein the lower layers 90a–d, commonly referred to as 90, are preferably comprised of polysilicon, amorphous silicon or other appropriate materials. The traces 50, 60, 70 & 80 formed of like materials with the requirement that these materials must be able to withstand high temperatures required in processing additional layers on top of the lower layers 90. The following discussion will use polysilicon by way of examples.

The lower layers 90 are preferably deposited on the beginning wafer 10 using chemical vapor deposition. All of the polysilicon traces 50, 60, 70 & 80 are formed in channels 20 which are etched into each layer 90 or wafer 10, substantially as described above with respect to the single layer polysilicon process. The channels and upper surfaces of each layer 90 and the wafer 10 are lined with an insulating layer, preferably comprised of silicon dioxide formed after the channels are formed. Alternately, the insulating layers can be formed of any suitable insulating materials, subject to the processing constraints encountered in adding additional layers of materials on the carrier.

In the embodiment depicted in FIG. 11, the wafer 10 has a trace 50 formed in channel 52 in its upper surface. Channel 52 and the upper surface of the wafer 10 are lined with an insulating layer 54, preferably silicon dioxide formed through oxidation. Insulating layer 54 can alternatively be formed of any suitable insulating materials. After the trace 50 is deposited and planarized (as described in the single layer polysilicon section above), a layer 56 of silicon nitride is deposited on the upper surface of the wafer 10 to cover the silicon dioxide layer 54 and trace 50. The silicon nitride 56 is deposited as an etch resist to protect the underlying silicon dioxide, silicon and/or polysilicon layers.

After the silicon nitride layer is in place, the first layer 90a of polysilicon is deposited on the upper surface of wafer 10. A layer of photoresist (not shown) is then used to pattern the traces in layer 90a. After patterning, the polysilicon layer 90a is etched to form channel 64 in layer 90a. After formation, the polysilicon in layer 90a is oxidized to form a layer of silicon dioxide 62 on its exposed surfaces. The silicon nitride 56, which does not oxidize in the above process, is then selectively etched where it is desired to make connections between traces in different layers, such as between traces 50 and 60 as shown.

At this point, the above process steps can be repeated to form any number of layers on the upper surface of wafer 10. In the embodiment shown in FIG. 11, layer 90b has a trace 70 formed in its upper surface. Trace 70 in layer 90b is depicted as being in electrical communication with trace 60 formed in layer 90a. Layer 90c has trace 80 formed in its upper surface which is connected to trace 70 in layer 90b.

The multi-layer construction of this embodiment allows for connection of layers of traces, providing increased flexibility in communication paths to chips eventually placed in such a carrier.

Layer 90d illustrates yet another advantage of multi-layer carriers in that layer 90d can be comprised of polysilicon that is doped to increase its conductivity and held at a constant potential to provide even more effective shielding between layers on the carrier. Layer 90d is deposited on an insulating layer 88 of silicon dioxide to prevent the doped polysilicon layer 90d from electrical connection with trace 80 in layer 90c. It will be understood by those skilled in the art that this isolation/shielding technique can be applied between any of the layers 90 to effectively shield separate conductive traces in the layers from each other and, further, can be used in conjunction with the other isolation/shielding techniques described above to provide even higher levels of isolation between traces in the chip carriers of the present invention.

The process of depositing additional polysilicon material, forming traces (either in channels or by doping polysilicon) can be repeated as many times as desired. In the preferred embodiment depicted in FIG. 11, four layers 90 are formed with a final layer 100 formed on the upper surface of the carrier in which the traces 24 are comprised of metallic material such as either gold, aluminum or a combination of gold and aluminum (if such a bi-metal system is desired and/or required). The details for depositing metal traces 24 are described above for the single layer carrier and will not be repeated here.

The metal trace 24 is preferably deposited last because metal traces typically cannot withstand the high temperatures required in processing the lower layers 90. The metal trace 24 is useful for bringing power into the carrier because of the electrical characteristics of metallic traces versus those formed of doped polysilicon.

Alternatively, the final layer can be comprised of doped polysilicon traces where its electrical characteristics are sufficient. In that case, however, the traces should terminate in metal bonding pads for ease in bonding the carriers to printed circuit boards or other components or in bonding chips to the traces. The metal bonding pads can be constructed substantially as described above.

The advantages of using polysilicon as the material to form each layer is that the polysilicon can be doped to provide more effective ground planes between levels of traces, as well as between traces in the same level. In addition, the polysilicon can be easily oxidized after it is etched to form the trace lines necessary and this oxidized polysilicon forms silicon dioxide which can act as an insulator between the traces when the doped polysilicon itself is maintained as a ground plane for isolation.

If such an isolation scheme is unnecessary or unwanted, the lower layers 90 can be formed of a variety of non-conductive materials including silicon nitride, silicon dioxide and various types of polyimides. Any of these materials can then be etched and either doped polysilicon traces or metal traces can be laid in the channels using the methods described above. The choice of material is, however, constrained by the requirements for later processing as well as etchability and other factors known to those skilled in the art.

Another advantage of using polysilicon in layers 90 is that high-yield passive components such as resistors 92 and capacitors 94 can be constructed within the layers 90 without significantly reducing yields of the carrier 90 due to component failures. This structure is highly manufacturable because the processes used to form the different layers 90 and their associated traces, with or without resistors and capacitors, are well known to those skilled in the art.

III. PASSIVATION AND CAVITY FORMATION

After the traces and bonding pads have been completed the processing of the single layer and multi-layer carriers again converges into a similar process in which the top surface of the carrier is passivated and the cavities are formed.

It should be noted, however, that in carriers with top layers of polysilicon the integrated circuit chips should still be mounted in cavities formed in the crystalline silicon wafer 10 because a crystallographic etch (described below) is necessary to produce the deep cavities required. In addition, if the chip is mounted on top of one or more polysilicon layers, much of the thermal conductivity advantages will be lost because almost all of the heat lost in conventional packages, especially those with lids, is lost through the bottom. As a result, if a multi-layer trace carrier is being processed, the first steps require the removal of any polysilicon layers in the areas of the cavities after which the processing is the same as for any other carrier.

Figure 12:
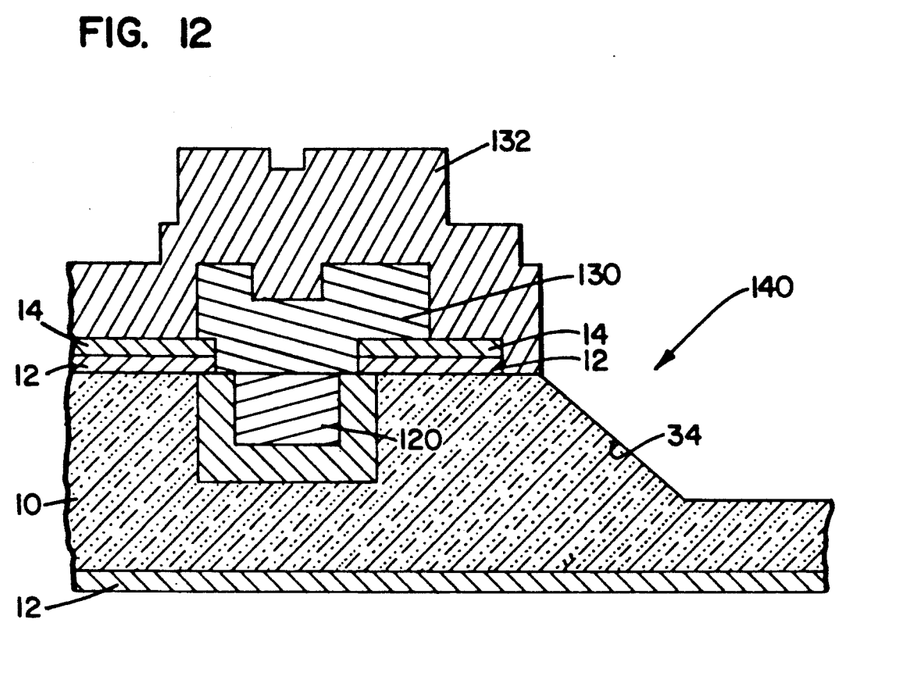
FIG. 12 is a partial cross-sectional view of a chip carrier of the present invention in which the traces and bonding pads are passivated and the chip cavity etched.
Figure 13:
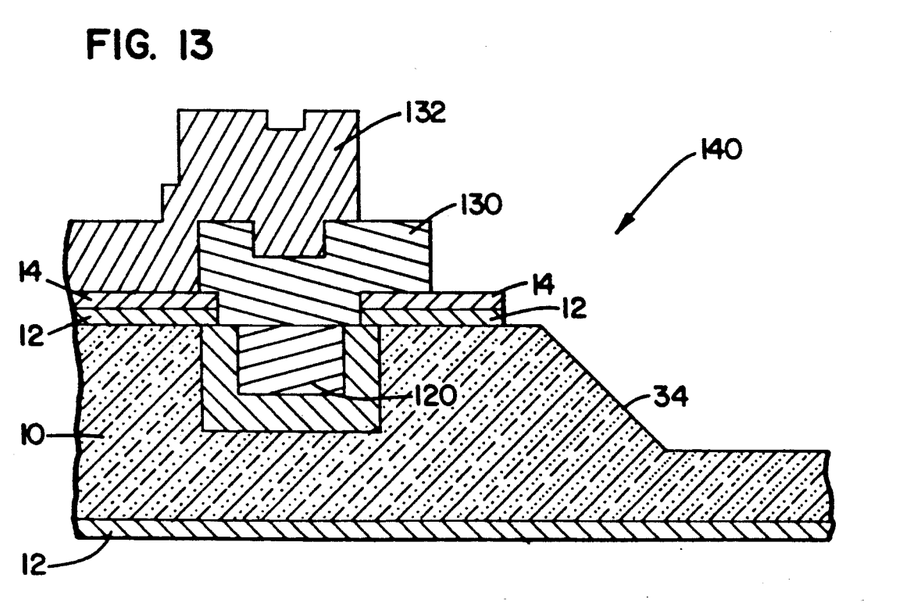
FIG. 13 is a partial cross-sectional view of a chip carrier of the present invention in which the passivation layer is partially removed to allow bonding to the bonding pads.

Referring to FIGS. 12 and 13, the carrier 140 is first coated with a passivation layer 132 (or scratch coat) to protect the traces and bonding pads 130 during handling of the carrier 140. The passivation layer 132 is preferably formed of a 9000 Å layer of plasma nitride. After the passivation layer 132 is in place, the top surface of the carrier 140 is coated with a photoresist material to define the cavities. After the photoresist material has been baked, exposed and developed to define the cavities, the layers of plasma nitride and plasma oxide 12 and 14 are removed from the cavity areas to allow the silicon wafer to be etched.

It is important to note that the cavities used in the carrier are essentially depressions in the top surface of the wafer and are not formed as voids or holes in the wafer. In the preferred embodiment, the cavities have a depth of 20 mils while the wafer has a thickness of 60 mils.

FIG. 12 describes the step of etching die cavities 34 into the wafer 10 to depth of 20 mils. In the preferred embodiment, the cavities can be etched in the silicon after the traces and bonding pads have been formed. It will be understood, however, that the cavities could be formed as the first step in production, or at any other step, provided that the masking material sufficiently protects the traces and bonding pads currently on the package. As one example, if the cavities are etched after the bonding pad metallization 130 and trace metallization 120 have been deposited, the masking material must be able to sufficiently protect these features with their large dimensions.

The die cavity 34 etch consists of a crystallographic etch step which etches both the <100> and <110> crystal planes of the silicon, leaving sloped <111> crystal plane sidewalls in the die cavities 34. In this embodiment, a starting wafer with a <100> surface plane is required. Dimensional control is dependent on the rotational orientation, so the cavities must be aligned to the <111> direction which is defined by the wafer flat. After the cavities 34 are defined, a partial etch of the passivation layer 132 occurs.

FIG. 13 describes the step of partially etching the plasma nitride layer 132, thereby uncovering portions of the traces and the bond pads. A portion of the plasma nitride layer 132 is left for scratch protection. The exposed bonding pads on the outer edge of the carrier provide enough area for bonding the carrier 140 to a circuit board or other device. The bonding pads 130 are also exposed so that they may be connected to the die in the cavity 34.

It will be understood by those skilled in the art that the cavities could also be mechanically formed in the carrier by use of a diamond drill or other suitable process. Passivation to protect the traces and bonding pads would also likely be necessary in a mechanical process, as described for the etched process.

Once the cavities 34 are fabricated, an integrated circuit die (not shown) is placed in a cavity 34 and bonded therein using known techniques. The connections between the bonding pads of the integrated circuit and the bonding pads on the carrier 110 can be made by a variety of techniques, for example, aluminum wire bonding, TAB tape bonding, or wire ribbon bonding. After bonding, the entire carrier 140 or just the individual cavity 34 may be hermetically sealed.

Figure 15:
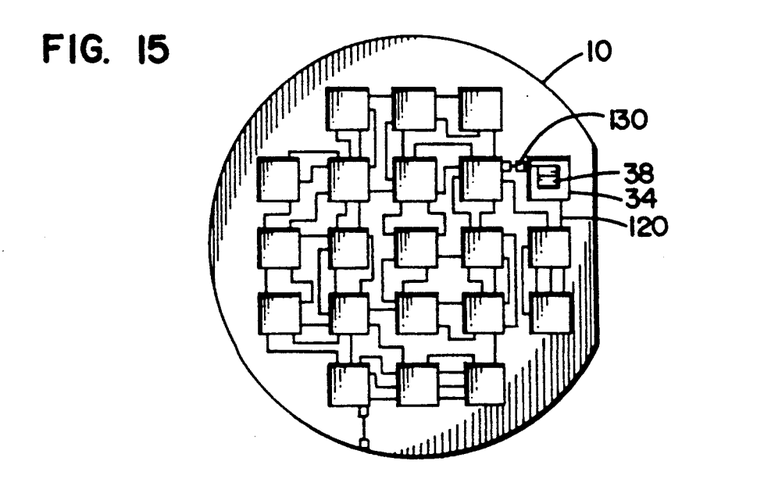
Figure 16:
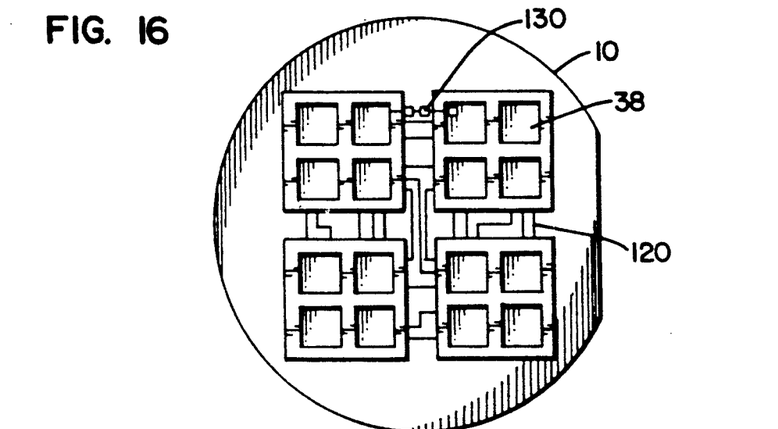
Figure 17:
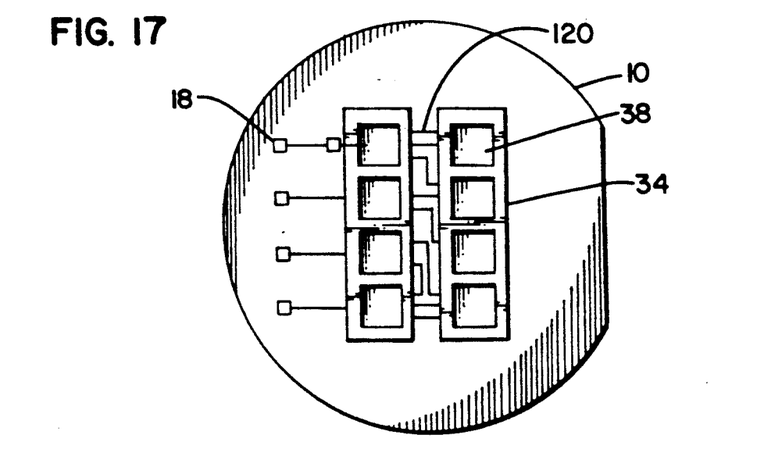

FIGS. 14-18 are top views of some typical wafer configurations. FIGS. 14 and 15 describe a wafer 10 containing twenty-one cavities 34. FIG. 16 describes a wafer 10 containing four large cavities 34, each cavity 34 holding a plurality of integrated circuits 38. FIG. 17 describes a wafer 10 containing two large cavities 34, each cavity 34 holding a plurality of integrated circuits 38 arrayed in a linear manner. The configuration in FIG. 12 is especially useful for memory integrated circuits 38 with bonding pads on only two sides.

In all the wafer configurations, the traces may electrically interconnect the cavities 34. The traces can be single or multi-layer metallization as described in greater detail above. Pads 130 allow for bonding between integrated circuits 38 and traces 120, or for bonding between traces 120 and devices external to the wafer 10. Preferably, Tape Automated Bonding techniques are used, such as those described in commonly assigned U.S. Pat. No. 4,949,453 issued Aug. 21, 1990 to E. F. Neumann et al. entitled "METHOD OF MAKING A CHIP CARRIER WITH TERMINATING RESISTIVE ELEMENTS", which patent is incorporated herein by reference.

Figure 18:
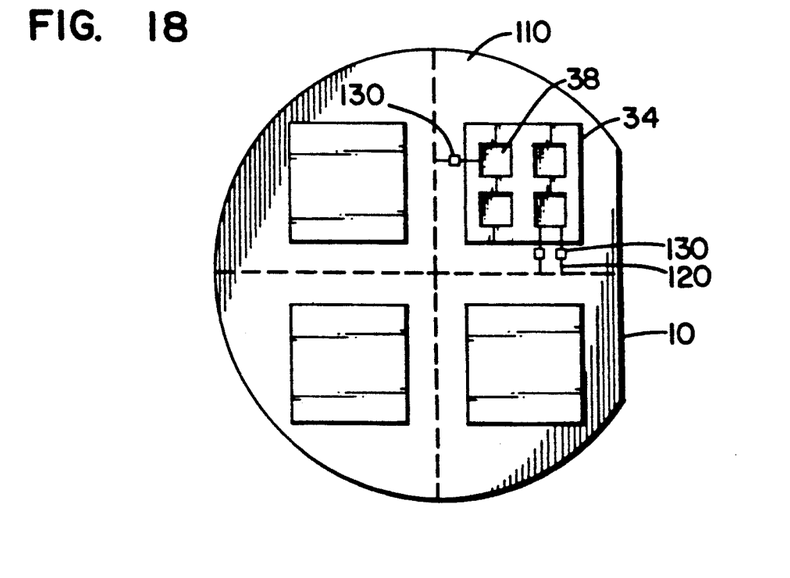
FIG. 18 shows the wafer configuration of FIG. 16, wherein the wafer is separated into individual carriers.

The wafer 10 may be left intact, or, individual carriers 110 may be separated from the wafer 10. The separate carriers 110 are identified by the dashed lines in FIGS. 14 and 18. FIG. 18 shows the configuration of FIG. 16, wherein the wafer 10 is separated along the dashed lines, thereby dividing the wafer 10 into quadrants so as to produce a plurality of multiple cavity carriers 110.

A lid may be used to hermetically seal each cavity 34, individual carriers 110, or the entire wafer 10. Individual sealing each cavity 34 or carrier 110 enhances reworkability.

In summary, a method of fabricating silicon packaging for integrated circuits utilizing channelled traces has been described. The preferred method of the present invention uses silicon to create carriers for integrated circuits because of silicon's numerous advantages.

The foregoing descriptions of the preferred methods of the invention have been presented for the purposes of illustration and description. They are not intended to be exhaustive or to limit the invention to the precise methods disclosed. Many modifications and variations are possible in light of the above teaching. It is intended that the scope of the invention be limited not by this detailed description, but rather by the claims appended hereto.

What is claimed is:

1. A method of fabricating at least one integrated circuit chip carrier, each chip carrier having at least one cavity for holding an integrated circuit chip, comprising the steps of:
   (a) providing a keyed wafer from silicon;
   (b) forming at least one channel in a top surface of the wafer, each channel being elongate and extending from proximate the at least one cavity to proximate a periphery of the chip carrier;
   (c) depositing a first conductive material in the at least one channel to form traces;
   (d) fabricating a plurality of bonding pads from a second conductive material on the top surface of the wafer, each bonding pad being in electrical communication with at least one of the traces;
   (e) depositing a passivation layer on the top surface of the wafer, the traces and the plurality of bonding pads;
   (f) etching the at least one cavity in the top surface of the wafer, each cavity being sized to contain at least one integrated circuit chip; and
   (g) partially etching the passivation layer so that at least one of the plurality of bonding pads is uncov- 2. The method of claim 1, wherein each of the first and second conductive materials comprises a first and second metal.

3. The method of claim 2, wherein the first and second metals are the same and are selected from the group consisting of gold or aluminum.

4. The method of claim 1, wherein the first conductive material comprises doped polysilicon.

5. The method of claim 1, further comprising the step of electrically isolating the at least one channel from the keyed wafer by oxidizing the surfaces of the at least one channel.

6. The method of claim 1, further comprising the steps of:
   a) doping the keyed wafer to make it electrically conductive; and
   b) electrically isolating the traces from the keyed wafer before depositing the first conductive material in the at least one channel.

7. The method of claim 1, further comprising the steps of:
   a) depositing a layer of doped polysilicon on the top surface of the keyed base wafer before the step of forming the at least one channel, the doped polysilicon providing electrically conductive material between the traces; and
   b) electrically isolating the traces from the doped polysilicon before depositing the first conductive material in the at least one channel.

8. The method of claim 1, further comprising the step depositing at least one barrier material on the first conductive material, the barrier material providing a diffusion barrier between the first conductive material and the second conductive material.

9. The method of claim 8, wherein the step of depositing a first conductive material further comprises depositing gold and the step of fabricating a plurality of bonding pads further comprises fabricating the plurality of bonding pads from aluminum.

10. The method of claim 8, wherein the step of depositing a barrier material further comprises selecting a barrier material from the group consisting of titanium-tungsten and titanium nitride.

11. A method of fabricating an integrated circuit chip carrier, the chip carrier having a cavity for holding an integrated circuit chip, comprising the steps of:
   (a) providing a keyed base wafer from silicon;
   (b) forming a channel in a top surface of the keyed base wafer, the channel being elongate and extending from proximate the cavity to proximate a periphery of the chip carrier;

(c) electrically isolating the channel from the keyed base wafer through oxidation of the surfaces of the channel;

(d) depositing a first conductive material in the channel to form a trace;

(e) fabricating a bonding pad on the top surface of the keyed base wafer, the bonding pad being fabricated from a second conductive material and further being in electrical communication with the trace;

(f) depositing at least one barrier material on the first conductive material to provide a diffusion barrier between the first conductive material of the trace and the second conductive material of the bonding pad;

(g) depositing a layer of passivation material on (1) the top surface of the keyed base wafer, (2) the trace, and (3) the bonding pad;

(h) etching the cavity in the top surface of the wafer, the cavity being sized to contain at least one integrated circuit chip; and (i) removing the passivation material so that at least a portion of the bonding pad is uncovered for bonding to other devices proximate the chip carrier via known bonding methods.

12. A method of fabricating n integrated circuit chip carrier, the chip carrier having a cavity for holding an integrated circuit chip, comprising the steps of:

(a) providing a keyed base wafer having a top surface;

(b) forming a plurality of trace layers on the top surface of the keyed base wafer, a first trace layer being formed in the top surface of the keyed base wafer, with traces in the first trace layer being formed in elongate channels formed in the top surface of the keyed base wafer, after formation of the first trace layer succeeding trace layers are formed above preceding trace layers and an uppermost trace layer is formed last having an uppermost raised top surface, the formation of each of the plurality of trace layers above the first trace layer further comprising the substeps of:

(1) depositing layer material on the top surface of the keyed base wafer to form a raised top surface;

(2) forming a channel in the raised top surface, the channel being elongate and extending from proximate the cavity to proximate a periphery of the chip carrier; and (3) depositing conductive trace material in the channel to form a trace;

(c) fabricating a bonding pad on the uppermost raised top surface, the bonding pad being in electrical communication with the trace of the uppermost trace layer;

(d) depositing a layer of passivation material on (1) the uppermost raised top surface, (2) the trace of the uppermost raised top surface, and (3) the bonding bad;

(e) providing a cavity in a selected area of the integrated circuit chip carrier, the cavity being sized to contain at least one integrated circuit chip; and (f) removing a portion of the passivation material so that at least a portion of the bonding pad is uncovered for bonding to other devices proximate the chip carrier via known bonding methods.

13. The method of claim 12, wherein the step of providing a cavity further comprises removing the plurality of trace layers from the selected area of the top surface of the keyed base wafer.

14. The method of claim 12, wherein the step of depositing the layer material of at least one of the plurality of trace layers further comprises depositing polysilicon as the layer material.

15. The method of claim 12, wherein the step of depositing the layer material of at least one of the plurality of trace layers further comprises depositing electrically conductive material as the layer material.

16. The method of claim 15, wherein the step of depositing the layer material of at least one of the plurality of trace layers further comprises depositing doped polysilicon as the layer material.

17. The method of claim 15, further comprising the step of electrically isolating the conductive trace material from the electrically conductive material deposited as the layer material.

18. The method of claim 17, wherein the step of electrically isolating further comprises oxidizing the surfaces of the channel formed in the at least one of the plurality of trace layers, the oxidizing occurring before depositing the conductive trace material in the channel formed in the at least one of the plurality of trace layers.

19. The method of claim 12, further comprising the steps of:

(1) forming a channel in the top surface of the keyed base wafer forming the first trace layer; and (2) depositing at least two conductive material in the channel formed in the top surface of the keyed base wafer to form a trace in the channel formed in the top surface of the keyed base wafer.

20. The method of claim 19, wherein the step of depositing at least one conductive material further comprises depositing doped polysilicon.

21. The method of claim 12, further comprising the step of depositing a shielding layer between a succeeding trace layer and a preceding trace layer to provide electrical shielding therebetween.

22. The method of claim 21, further comprising the step of electrically isolating the shielding layer from the succeeding trace layer and preceding trace layer.

23. The method of claim 2 , wherein the step of electrically isolating the shielding layer further comprises:

(1) providing a first layer of a non-conductive material on the raised top surface of the preceding trace layer before depositing the shielding layer; and (2) providing a second layer of a non-conductive material on a top surface of the shielding layer before depositing the succeeding trace layer.

24. The method of claim 12, wherein the step of forming a plurality of trace layers further comprises forming a via between at least one succeeding trace layer and at least one preceding trace layer such that the trace in the at least one succeeding trace layer is in electrical communication with the trace in the at least one preceding trace layer.

25. The method of claim 12, wherein the step of forming a plurality of trace layers further comprises forming a passive electrical component in at least one of the plurality of trace layers, the component being in electrical communication with a trace.

26. The method of claim 25, further comprising the step of selecting the passive component from the group consisting of resistors and capacitors.

27. The method of claim 12, wherein the step of depositing conductive trace material further comprises depositing a trace metal in the channel formed in the uppermost trace layer.

28. The method of claim 27, wherein the step of forming a plurality of trace layers further comprises depositing doped polysilicon as the conductive trace material in the plurality of trace layers formed below the uppermost trace layer.

29. The method of claim 27, further comprising the step of selecting the trace metal from the group consisting of gold and aluminum.

30. The method of claim 27, further comprising the step of depositing at least one barrier material on the trace metal, the barrier material providing a diffusion barrier between the trace metal and the bonding pad.

31. The method of claim 30, wherein the step of depositing conductive trace material in the uppermost raised top surface further comprises depositing gold, and further wherein the step of fabricating the bonding pad further comprises fabricating the bonding pad from aluminum.

32. The method of claim 31, wherein the step of depositing at least one barrier material further comprises selecting a barrier material from the group consisting of titanium tungsten and titanium nitride.

33. A method of fabricating an integrated circuit chip carrier, the chip carrier having a cavity for holding an integrated circuit chip, comprising the steps of:
 (a) providing a keyed base wafer having a top surface;
 (b) forming a plurality of trace layers on the top surface of the keyed base wafer, a first trace layer being formed in the top surface of the keyed base wafer, with traces in the first trace layer being formed in elongate channels formed in the top surface of the keyed base wafer, after formation of the first trace layer succeeding trace layers are formed above preceding trace layers and an uppermost trace layer is formed last having an uppermost raised top surface, the formation of each of the plurality of trace layers above the first trace layer further comprising the substeps of:
  (1) depositing polysilicon to form a raised top surface;
  (2) forming a channel in the raised top surface, the channel being elongate and extending from proximate the cavity to proximate a periphery of the chip carrier;
  (3) depositing conductive trace material in the channel to form a trace; and
  (4) electrically isolating the trace from the polysilicon;
 (c) fabricating a bonding pad on the uppermost raised top surface, the bonding pad being in electrical communication with the trace of the uppermost trace layer;
 (d) depositing a layer of passivation material on (1) the uppermost raised top surface, (2) the trace of the uppermost raised top surface, and (3) the bonding pad;
 (e) providing a cavity in a selected area of the integrated circuit chip carrier, the cavity being sized to contain at least one integrated circuit chip; and
 (f) removing a portion of the passivation material so that at least a portion of the bonding pad is uncovered for bonding to other devices proximate the chip carrier via known bonding methods.

* * * * *

UNITED STATES PATENT AND TRADEMARK OFFICE
CERTIFICATE OF CORRECTION

PATENT NO. : 5,196,377
DATED : March 23, 1993
INVENTOR(S) : Wagner et al.

It is certified that error appears in the above-identified patent and that said Letters Patent is hereby corrected as shown below:

In column 3, line 7, delete "homogenous" and insert --homogeneous-- therefore.

In column 12, line 16 (claim 1(g)), delete "uncov-" and insert --uncovered for bonding to other devices proximate the chip carrier via known bonding methods.-- after the word "is" therefore.

In column 12, line 48 (claim 8), insert --of-- after the word "step" therefore.

In column 13, line 27 (claim 12), "n" should read --an-- therefore.

In column 13, line 59 (claim 12(d)), "bad" should read --pad-- therefore.

In column 14, line 30 (claim 19(2)), "two" should read --one-- therefore.

Signed and Sealed this

Eleventh Day of January, 1994

Attest:

BRUCE LEHMAN

Attesting Officer

Commissioner of Patents and Trademarks